United States Patent
Lai et al.

(10) Patent No.: US 6,826,051 B2
(45) Date of Patent: Nov. 30, 2004

(54) CLIP FOR HEAT SINK

(75) Inventors: Cheng-Tien Lai, Tu-Chen (TW); Tony Zhou, Shenzhen (CN)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 52 days.

(21) Appl. No.: 10/409,214

(22) Filed: Apr. 7, 2003

(65) Prior Publication Data

US 2004/0047131 A1 Mar. 11, 2004

(30) Foreign Application Priority Data

Sep. 9, 2002 (TW) .................................. 91214016 U

(51) Int. Cl.$^7$ ................................................ H05K 7/20
(52) U.S. Cl. .................. 361/704; 24/457; 248/505; 248/510; 257/719; 361/710; 361/690
(58) Field of Search ................. 24/295–296, 457–458, 24/573, 625; 165/80.2–80.3, 185; 248/505, 510; 257/718–719, 726–727; 361/687–710, 715, 719–721, 753–754, 758, 798, 801–802

(56) References Cited

U.S. PATENT DOCUMENTS 6,181,559 B1 * 1/2001 Seo ........................... 361/704
6,430,051 B1 * 8/2002 Yang et al. .................. 361/704
6,477,049 B1 * 11/2002 Lin ............................. 361/704
6,532,153 B1 * 3/2003 Chiu ........................... 361/703
6,542,367 B2 * 4/2003 Shia et al. ................... 361/703

FOREIGN PATENT DOCUMENTS

TW 456586 9/2001

* cited by examiner

Primary Examiner—Gregory D. Thompson
(74) Attorney, Agent, or Firm—Wei Te Chung

(57) ABSTRACT

A clip (1) is used to attach a heat sink (2) onto a central processing unit (3). The clip includes a main body (10) and an operating body (20). The main body includes a central pressing portion (101), a pair of first and second spring arms (103, 102) extending from the pressing portion, and a first leg (104) depending from the first spring arm. Two pins (106) extend outwardly from opposite sides of a free end of the second spring arm. The operating body includes a handle (201), and a second leg (202) depending from the handle. The second leg defines an opening (212) bounded by two side walls (204). A slideway (205) is defined in an inner surface of each side wall, the slideway slidably receiving a corresponding pin therein. When the handle is pressed downwardly, the pins slide downwardly to be retained at bottoms (206) of the slideways.

20 Claims, 5 Drawing Sheets

CLIP FOR HEAT SINK

BACKGROUND OF THE INVENTION

1. Field of the Invention

The present invention relates to clips for securing heat sinks, and particularly to a clip for attaching a heat sink to an electronic package such as a central processing unit (CPU).

2. Description of Related Art

A CPU is the core administrator of electrical signals in many contemporary computers. Continued development of CPUs has enabled them to perform more and more functions. Heat generated by CPUs is increasing along with such developments. Overheating can adversely affect the operational stability of computers. Measures must be taken to efficiently remove the heat from the CPU. Typically, a heat sink having great heat conductivity is mounted on the CPU to remove heat therefrom. A clip is frequently used to facilitate firm attachment of the heat sink to the CPU, thus achieving greater efficiency of heat dissipation.

A conventional clip for securing a heat sink to a CPU comprises a central horizontal pressing portion, a pair of opposite spring arms extending outwardly and upwardly from the pressing portion, and a pair of legs respectively depending from the spring arms. Each leg defines an opening for engaging with a corresponding catch of a socket. When the spring arms are pressed, this causes the legs to move downwardly and outwardly. Then when the pressure on the spring arms is released, the legs resiliently rebound slightly so that the openings engagingly receive the corresponding catches of the socket. The heat sink is thereby secured to the CPU.

However, pressing of the spring arms of the clip requires excessive manual effort, and can easily hurt an operator's hands. Furthermore, it is necessary to provide a tool to detach the clip from the heat sink. Consequently, detachment is inconvenient and is liable to result in accidental slippage and damage to other nearby components of the computer.

Thus, a clip which can overcome the above-mentioned problems is strongly desired.

SUMMARY OF THE INVENTION

Accordingly, an object of the present invention is to provide a clip which can readily and reliably attach a heat sink to an electronic package such as a CPU.

Another object of the present invention is to provide a clip allowing ready detachment of a heat sink from an electronic package such as a CPU without the need for a tool.

In order to achieve the objects set out above, a clip of the present invention is used to attach a heat sink onto a CPU. The clip comprises a main body and an operating body. The main body comprises a central pressing portion, a pair of first and second spring arms extending from the pressing portion, and a first leg depending from the first spring arm. Two pins extend outwardly from opposite sides of a free end of the second spring arm. The operating body includes a handle, and a second leg depending from the handle. The second leg defines an opening and forms two side walls. A slideway is defined in an inner surface of each side wall, slidably receiving a corresponding pin therein. When the handle is pressed downwardly, the pins slide downwardly to be retained at bottoms of the slideways.

Other objects, advantages and novel features of the present invention will become more apparent from the following detailed description when taken in conjunction with the accompanying drawings.

DETAILED DESCRIPTION OF THE INVENTION

Figure 1:
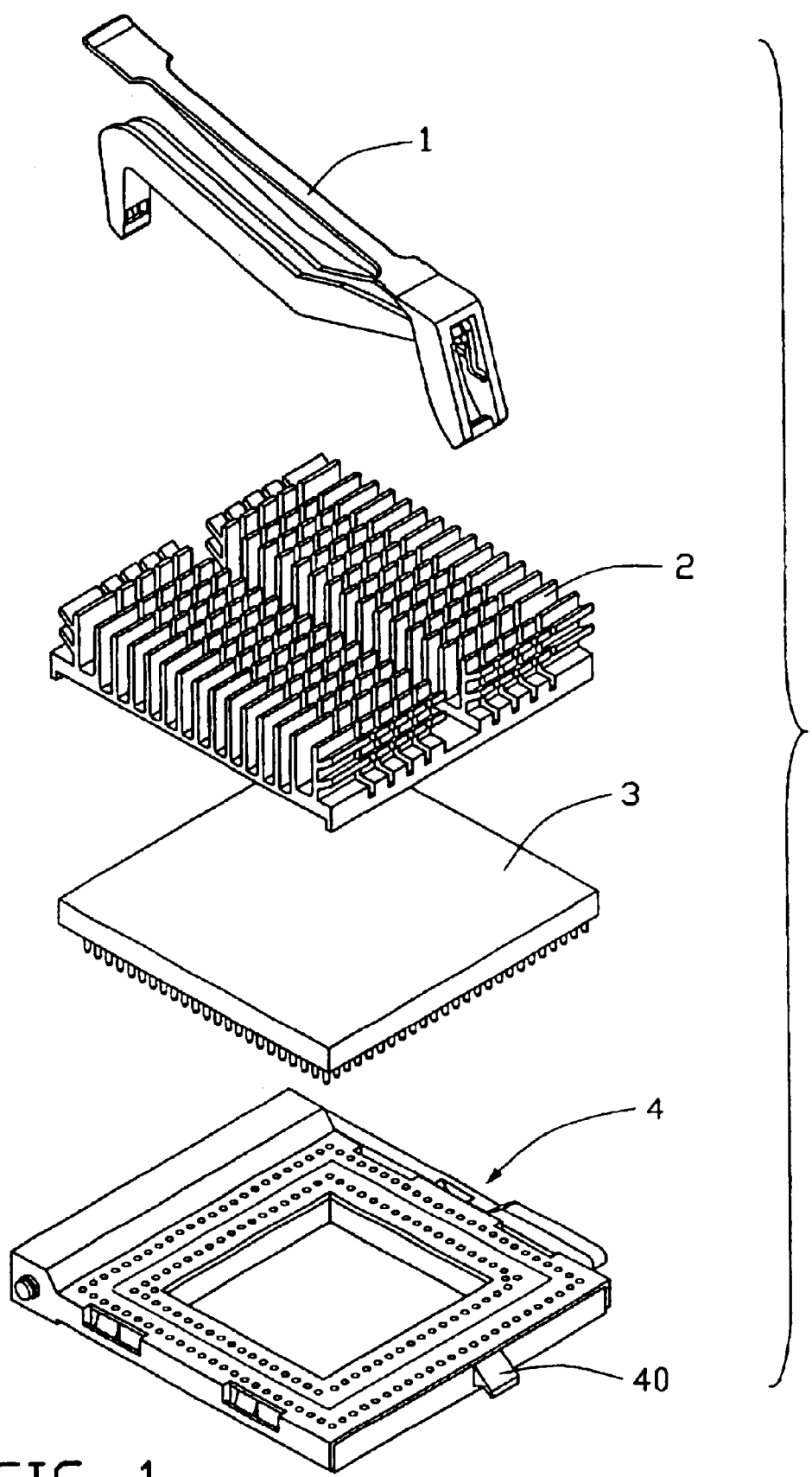
FIG. 1 is an exploded, isometric view of a clip in accordance with a preferred embodiment of the present invention, together with a heat sink, a CPU and a socket.

Reference will now be made to the drawing figures to describe the present invention in detail.

Figure 2:
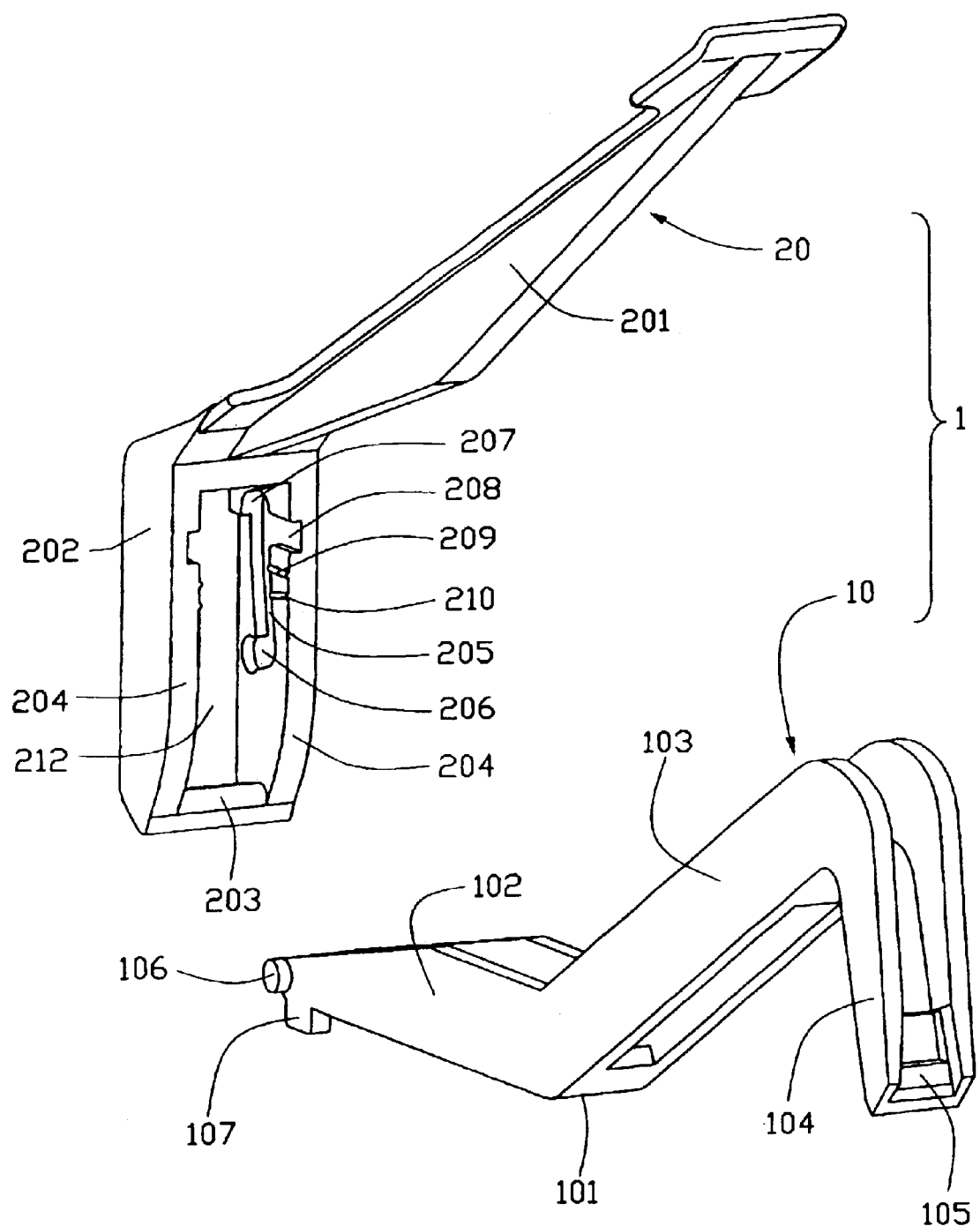
FIG. 2 is an enlarged, exploded view of the clip of FIG. 1, but viewed from another aspect.

Referring to FIGS. 1 and 2, a clip 1 of the present invention comprises a main body 10 and an operating body 20. The clip 1 is used to secure a heat sink 2 to a CPU 3 mounted on a socket 4. Two opposite sides of the socket 4 form a pair of catches 40 respectively.

Referring particularly to FIG. 2, the main body 10 of the clip 1 has a central pressing portion 101, for pressing the heat sink 2 onto the CPU 3. A first spring arm 103 and a second spring arm 102 extend outwardly and upwardly from opposite ends of the pressing portion 101, respectively. A first leg 104 depends from a distal end of the first spring arm 103. A first retaining portion 105 is formed at a bottom portion of the first leg 104, for engaging with one of the catches 40 of the socket 4. Opposite sides of a free end of the second spring arm 102 extend outwardly to form a pair of pins 106, respectively. A pair of blocks 107 depends from the opposite sides of the free end of the second spring arm 102 respectively.

The operating body 20 comprises a handle 201, and a second leg 202 depending from the handle 201. A rectangular opening 212 is defined in the second leg 202. An inner surface of each of opposite side walls 204 bounding the opening 212 defines a slot 208, and a slanting slideway 205 in communication with the slot 208. A width of the slot 208 increases gradually from the slideway 205 to a distal edge of the side wall 204. Each pin 106 of the second spring arm 102 can be deformably received in the corresponding slot 205 and slid into the corresponding slideway 205. Each pin 106 is able to slide up and down in the corresponding slideway 205. A top end of each slideway 205 defines a first concavity 207, and a bottom end of each slideway 205 defines a second concavity 206. The first concavities 207 and the second concavities 206 are each able to receive the corresponding pins 106 therein. A first protruding portion 209 and a second protruding portion 210 are formed on the inner surface of each side wall 204. The first protruding portion 209 and the second protruding portion 210 are located between the first concavity 207 and the second concavity 206, with the first protruding portion 209 nearest to the first concavity 207. The first protruding portions 209 and the second protruding portions 210 of the side walls 204 interfere with corresponding blocks 107 of the main body 10, so that suitable force must be applied to the operating body 20 in order to be able to slide the pins 106 down in the corresponding slideways 205. Each slideway 205 slants gradually from the first concavity 207 to the second concavity 206, such that the slideway 205 at the second concavity 206 is slightly nearer the distal edge of the corresponding side wall 204. An end of the second leg 202 forms a second retaining portion 203, for engaging with the other of the catches 40 of the socket 4.

Figure 3:
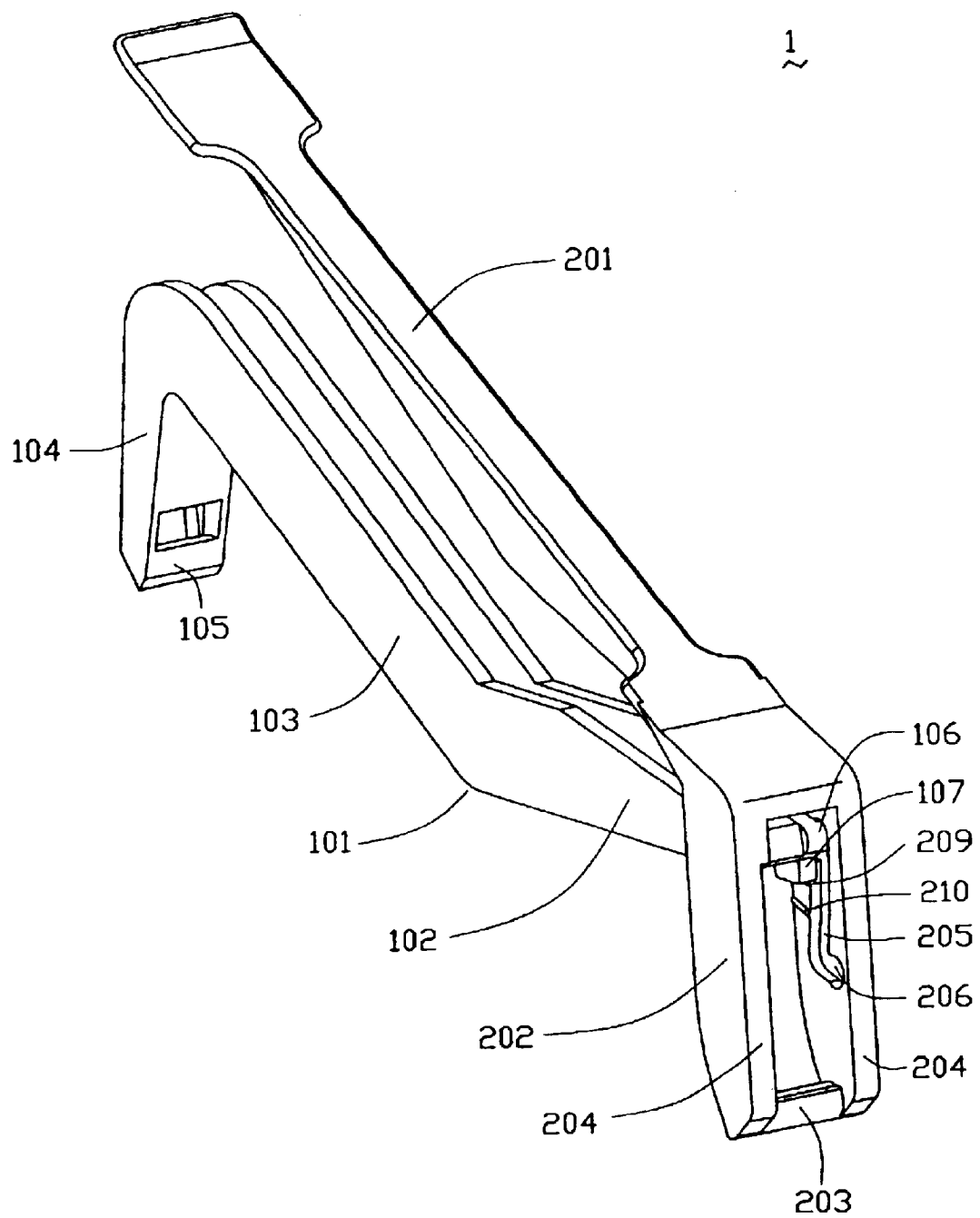
FIG. 3 is an enlarged view of the clip of FIG. 1.
Figure 4:
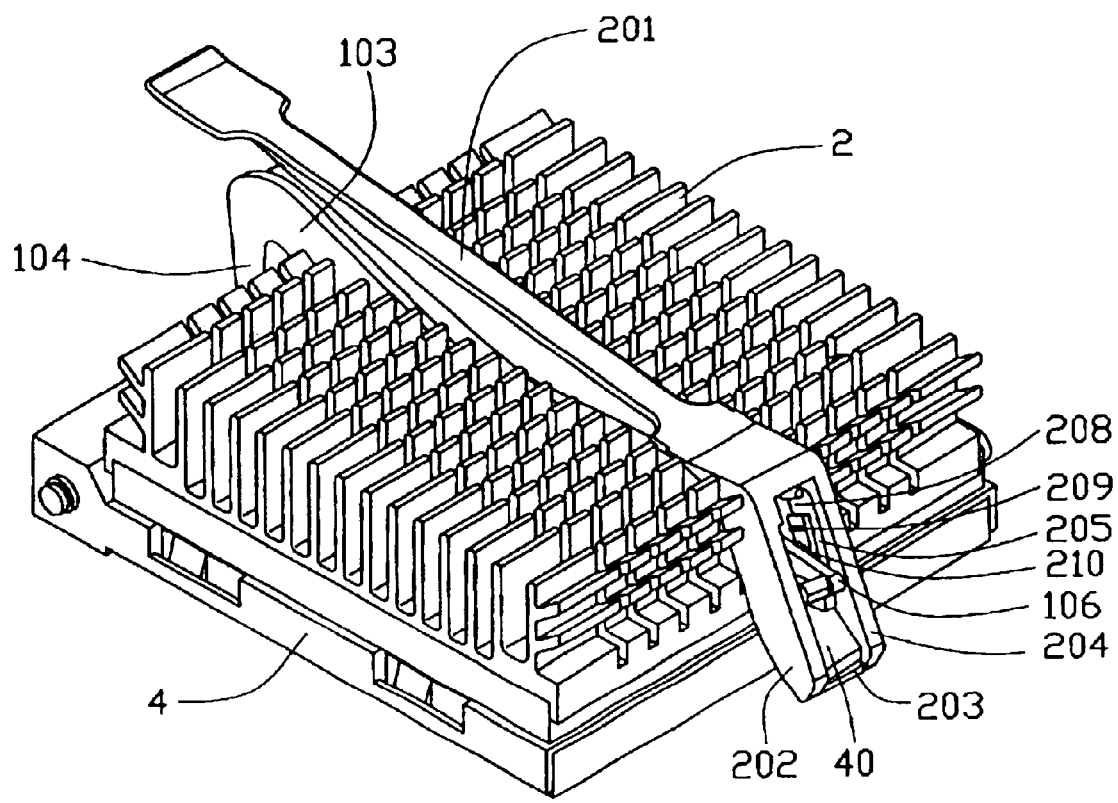
FIG. 4 is an assembled view of FIG. 1.

Referring to FIG. 3, in assembly of the clip 1, the pins 106 of the main body 10 are pushed in the slots 208 of the operating body 20. Then, the pins 106 are slid in the slideways 205 of the operating body 20, and are received in the first concavities 207. The blocks 107 of the main body 10 are obstructed by the first protruding portions 209 of the operating body 20, so that suitable force must be applied to the operating body 20 in order to be able to slide the pins 106 down in the corresponding slideways 205. The clip 1 is thus easily assembled.

Referring to FIGS. 1 to 4, in assembly of the clip 1 to the socket 4, the CPU 3 is firstly mounted on the socket 4. The heat sink 2 is placed on a top surface of the CPU 3. The clip 1 is received in a central channel of the heat sink 2, and rests on a top surface of a base of the heat sink 2 in the central channel. The clip 1 spans between the catches 40 of the socket 4, with the first and second retaining portions 105, 203 loosely contacting the catches 40 of the socket 4. The handle 201 is pressed downwardly, so that the pins 106 of the main body 10 move from the first concavities 206 to the second concavities 207 along the slideways 205 of the opening 212, whereupon the pins 106 lockingly engage in the second concavities 207. During this operation, the blocks 107 of the main body 10 move from above the first protruding portions 209 to below the second protruding portions 210. The first and second retaining portions 105, 203 resiliently engage with undersides of the catches 40 of the socket 4, thereby securing the heat sink 2 to the CPU 3.

In disassembly of the clip 1 from the socket 4, the handle 201 is pulled upwardly, so that the pins 106 exit the second concavities 206, and resiliently travel back along the slideways 205 of the opening 212. Thus, the first and second retaining portions 105, 203 only loosely contact the catches 40 of the socket 4. The clip 1 is then easily removed from the socket 4.

Figure 5:
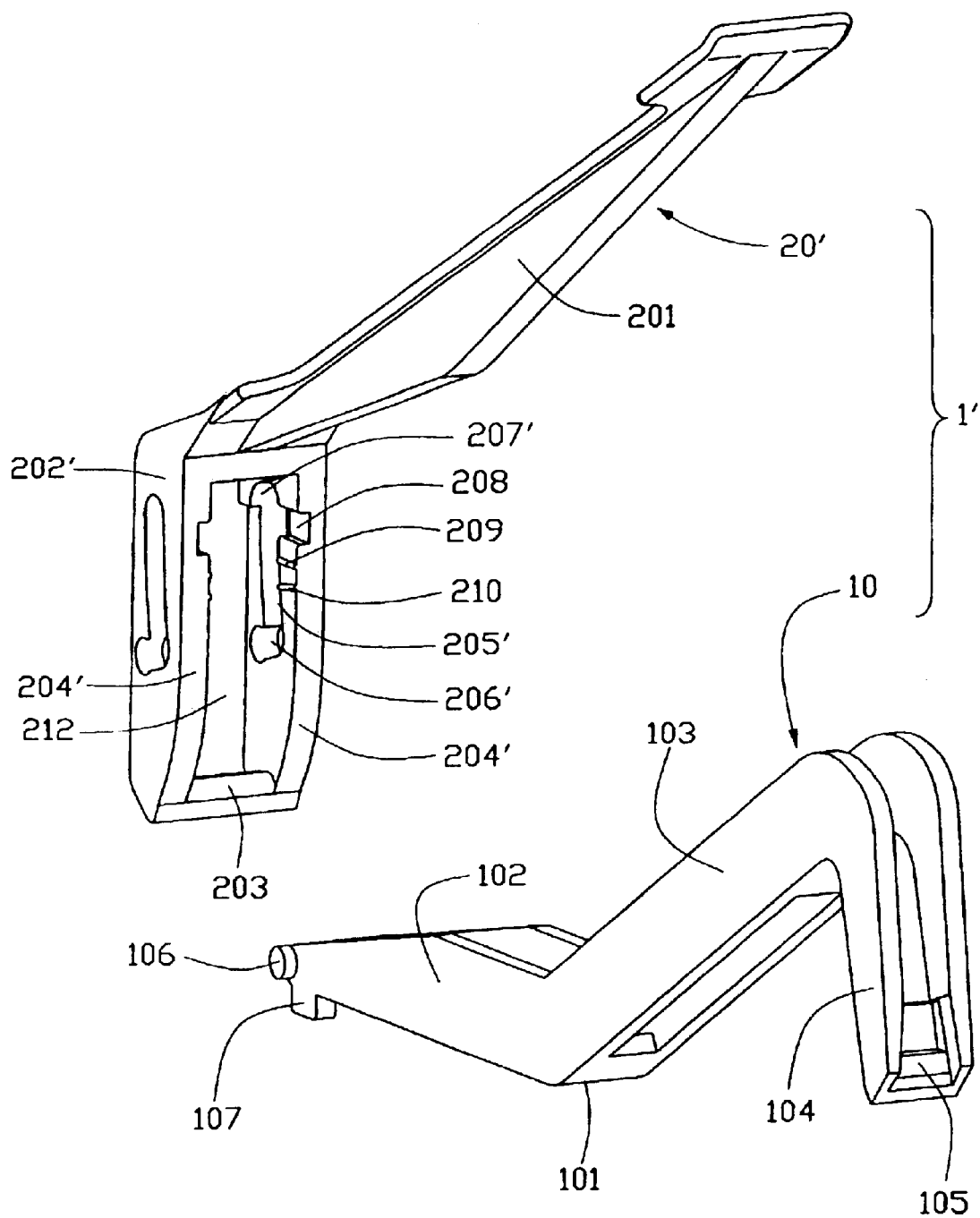
FIG. 5 is an exploded, isometric view of a clip in accordance with an alternative embodiment of the present invention.

A clip 1' in accordance with an alternative embodiment of the present invention is shown in FIG. 5. The clip 1' is similar to the clip 1 of the preferred embodiment. The distinguishing features of the clip 1' are slideways 205', first concavities 207' and second concavities 206', all of which span respective full thicknesses of two side walls 204' of an operating body 20'. This configuration helps eliminate wicking when the operating body 20' is molded during manufacturing thereof.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the fill extent indicated by the broad general meaning of the terms in which the appended claims are expressed.

What is claimed is:

1. A clip for securing a heat sink onto an electronic package, the clip comprising:
   a main body comprising a pressing portion, and first and second spring arms extending from respective opposite ends of the pressing portion, a first leg depending from the first spring arm, and at least one pin extending from the second spring arm; and
   an operating body comprising a handle, and a second leg depending from an end of the handle, the second leg defining at least one slideway for slidingly receiving the at least one pin of the main body therein, wherein a retaining portion is formed at an end of each of the first and second leg.

2. The clip as described in claim 1, wherein the second leg defines an opening bounded by two opposite side walls.

3. The clip as described in claim 2, wherein the at least one slideway is slantedly defined in at least one of the side walls.

4. The clip as described in claim 2, wherein the second leg of the operating body defines a pair of slideways in the side walls thereof, and opposite sides of a free end of the second spring arm form a pair of pins slidable in the corresponding slideways of the second leg.

5. The clip as described in claim 4, wherein each of the slideways of the side walls comprises a first concavity and a second concavity respectively at a top end and a bottom end thereof, the first and second concavities being for receiving corresponding pins therein.

6. The clip as described in claim 5, wherein the inner surface of each of the side walls forms at least one protruding portion.

7. The clip as described in claim 6, wherein a free end of the second spring arm of the operating body forms a pair of blocks respectively engaging with the at least one protruding portions so that external force must be applied to the clip in order to be able to slide the pins down in the corresponding slideways.

8. The clip as described in claim 5, wherein the inner surface of each of the side walls defines a slot in communication with a corresponding slideway, for allowing entry of the corresponding pin of the main body into the slideway.

9. The clip as described in claim 8, wherein a width of each slot increases gradually from the slideway to a periphery of the side wall, so that the pin is deformably received in the slideway.

10. The clip as described in claim 5, wherein the slideways and the first and second concavities span respective full thicknesses of the side walls.

11. A heat dissipating assembly, comprising:
   a socket received a CPU therein;
   a heat sink attached on the CPU; and
   a clip attached on the heat sink and engaged with the socket thereby attaching the heat sink to the CPU, the clip comprising a main body and an operating body, the main body comprising a pressing portion pressing on the heat sink, one end of the main body forming at least one pin, a first leg extending from an opposite end of the main body, the operating body comprising a handle and a second leg extending from an end of the handle, the first and second legs each defining a retaining portion engaging with the socket, the second leg defining at least one slideway slidably receiving the at least one pin of the main body therein; wherein
   when the handle is pressed, the at least one pin slides along the at least one slideway and enters a concavity defined at an end of the at least one slideway.

12. The heat dissipating assembly as described in claim 11, wherein the main body of the clip further comprises a first spring arm and a second spring arm respectively extending outwardly and upwardly from opposite ends of the pressing portion, and the first leg depends from the first spring arm.

13. The heat dissipating assembly as described in claim 12, wherein the main body of the clip forms two pins at opposite sides of a free end of the second spring arm.

14. The heat dissipating assembly as described in claim 13, wherein the second leg of the operating body defines an opening bounded by two opposite side walls.

15. The heat dissipating assembly as described in claim 14, wherein the second leg of the operating body defines two slideways in the side walls respectively.

16. The heat dissipating assembly as described in claim 11, wherein the at least one slideway is slantedly defined in the second leg of the operating body.

17. The heat dissipating assembly as described in claim 14, wherein each of the side walls of the operating body forms at least one protruding portion, a pair of blocks is formed at the free end of the second spring arm of the main body, the blocks respectively engaging with the at least one protruding portions so that external force must be applied to the clip in order to be able to slide the pins in the corresponding slideways toward corresponding cavities.

18. The heat dissipating assembly as described in claim 11, wherein each of the side walls of the operating body defines a slot in communication a corresponding slideway, for allowing entry of a corresponding pin of the main body into the slideway.

19. A heat dissipating assembly comprising:
a heat sink positioned upon a heat generating device;
a clip disposed upon the heat sink, said clip including a main body and an operation body, the main body including a pressing portion downwardly pressing the heat sink, and a first leg downwardly extending from one end of the main body, said operation body slidably and pivotally attached to the other end of the main body and defining a handle and a second leg downwardly extending therefrom, the handle extending in a direction along said pressing portion and away from the second leg but toward the first leg, said first and second legs including retention means for assuring a tensioned manner between the heat sink and the heat generating device; wherein
in assembling the clip to the heat sink, the handle is pulled in said direction to have the pressing portion in the tensioned manner for locking said heat sink on the heat generating device; in disassembling the clip from the heat sink, the handled is roughly rotatably moved upwardly about the retention means of the second leg so as to have the pressing portion in a relaxed manner for unlocking the heat sink with regard to the heat generating device.

20. The assembly as described in claim 19, wherein said handle extends along said direction with an operation end located above the first leg.

* * * * *